(12) United States Patent
Kahng et al.

(10) Patent No.: US 7,865,856 B1
(45) Date of Patent: Jan. 4, 2011

(54) SYSTEM AND METHOD FOR PERFORMING TRANSISTOR-LEVEL STATIC PERFORMANCE ANALYSIS USING CELL-LEVEL STATIC ANALYSIS TOOLS

(75) Inventors: Andrew B. Kahng, Del Mar, CA (US); Puneet Gupta, Los Angeles, CA (US); Saumil Shah, Santa Clara, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 272 days.

(21) Appl. No.: 12/075,654

(22) Filed: Mar. 12, 2008

Related U.S. Application Data

(60) Provisional application No. 60/906,443, filed on Mar. 12, 2007.

(51) Int. Cl.
*G06F 17/50* (2006.01)
(52) U.S. Cl. ............... 716/6; 716/4; 716/5; 703/14
(58) Field of Classification Search ............ 716/4–6; 703/14
See application file for complete search history.

(56) References Cited

U.S. PATENT DOCUMENTS

| | | | | |
|---|---|---|---|---|
| 5,036,473 A | * | 7/1991 | Butts et al. ............ | 703/23 |
| 5,625,803 A | * | 4/1997 | McNelly et al. ......... | 703/14 |
| 5,692,160 A | * | 11/1997 | Sarin ..................... | 703/23 |
| 5,734,798 A | * | 3/1998 | Allred ................... | 706/47 |
| 5,872,953 A | * | 2/1999 | Bailey ................... | 703/16 |
| 7,243,320 B2 | * | 7/2007 | Chiu et al. .............. | 716/4 |
| 7,469,394 B1 | * | 12/2008 | Hutton et al. ........... | 716/6 |
| 2003/0099129 A1 | * | 5/2003 | Amatangelo et al. ..... | 365/154 |
| 2007/0006110 A1 | * | 1/2007 | Naka et al. ............. | 716/12 |
| 2009/0019411 A1 | * | 1/2009 | Chandra et al. ......... | 716/9 |

OTHER PUBLICATIONS

Sherwood, W. "A MOS Modelling Technique for 4-State True-Value Hierarchical Logic Simulation or Karnough Knowledge"; Design Automation; 18th Conference on Jun. 29, 1981; pp. 775-785.*

* cited by examiner

*Primary Examiner*—Naum B Levin
(74) *Attorney, Agent, or Firm*—Martine Penilla & Gencarella, LLP

(57) ABSTRACT

A method of using a static performance analyzer that accepts as input a cell-level netlist, to perform static performance analysis on a circuit represented by a transistor level netlist. The method begins with converting said transistor-level netlist to a cell-level netlist by modeling individual transistors with a cell model. Then, a static performance analyzer is used to perform a static performance analysis of said cell-level netlist. Among performance characteristics that may be analyzed are timing (static timing analysis) and leakage power. The method described may also be used for statistical static timing and power analysis.

11 Claims, 8 Drawing Sheets

SYSTEM AND METHOD FOR PERFORMING TRANSISTOR-LEVEL STATIC PERFORMANCE ANALYSIS USING CELL-LEVEL STATIC ANALYSIS TOOLS

CROSS-REFERENCE TO RELATED APPLICATIONS

This application claims the benefit of provisional application Ser. No. 60/906,443, filed Mar. 12, 2007.

BACKGROUND

The present invention relates to transistor-level static performance analysis SPA methods. SPA is a method of bounding the performance of an integrated circuit (IC) design, prior to actually creating the IC in silicon. This is done by postulating worst case or best case performance at every signal flow juncture, for worst case or best case bounds, respectively. One particularly important type of SPA is static timing analysis (STA), in which timing performance is bounded. In STA, both best and worst case bounds are critical for insuring that there will be no timing mismatches, internal and external to the chip. Another technique, known as dynamic timing analysis, is the process of simulating circuit performance for a particular input set or vector. Unfortunately, for large circuits this technique becomes impractical due to the huge number simulation runs, each with a different input vector, which would have to be performed to gain a good confidence level that a worst case input vector had been identified. Because of its great importance, much of the discussion in this application is presented in terms of STA, although in some cases it could be generalized to include other types of performance. It may be noted that SPA also includes statistical analysis, that is analysis which does not presume a best or worst case performance for every device forming a part of the overall circuit, but which presumes a variation in device performance and arrives at a statistical distribution of IC performance results.

It is common to design an IC at the cell-level, using cells such as logic gates and flip-flops as the basic building blocks. In complementary metal oxide semiconductor (CMOS) circuitry, which is by far the most popular form of integrated circuitry, the distinction between a cell and a transistor is particularly clear. CMOS circuitry is made up of complementing negative doped metal oxide semiconductor (NMOS) and positive doped metal oxide semiconductor (PMOS). In CMOS even the simplest functional unit (that is, "cell"), such as an inverter, must include two complementary transistors. Because of the general tendency to design at the cell level; the most common STA tools are cell level tools, a leading example being Synopsis PrimeTime®. To use this type of tool, the delay information for each type of cell is pre-computed and subsequently used for performing STA on the circuit using a cell-level STA engine. In some situations, however, it is still necessary, in order to meet tight performance requirements, to design custom circuits and/or portions of an IC at the transistor-level. Because it is more unusual to design circuits at the transistor level, the tool suite available for performing STA at the transistor level is less robust than at the cell-level. Although at least one transistor-level STA tool does exist, it is less widely available than the cell-level timing tools. Accordingly, it would be a great benefit to IC designers, if there was some way to use cell-level STA tools to analyze a circuit designed at the transistor-level.

SUMMARY OF THE INVENTION

The invention may take the form of a method and a system of using an existing cell-level static performance engine to perform transistor-level static performance analysis, by separately modeling for at least some of the transistors, each transistor as a standard cell. In one preferred embodiment static timing analysis is performed, while in another preferred embodiment static leakage power analysis is performed. The method depends on the observation that a tri-state buffer can be used to model a single transistor. The method also depends on the recognition that sophisticated numerical and graph-theoretic algorithms embedded in a cell-level static performance analysis engine and the ability of such an engine to comprehend a variety of constraints can be used to model inter-transistor effects.

For the static timing analysis (STA) embodiment, the gate-to-drain and source-to-drain delays for each transistor-equivalent cell are obtained using a circuit simulator and stored, as cell information, in the STA engine cell library. For a Synopsis STA system, the library in which cell information is stored is referred to as Synopsys Liberty (.lib). The cell-level netlist and characterized cell library files are used in an STA flow for worst-case (or best-case) timing analysis. Using this flow, transistor-level timing analysis can be performed with good absolute accuracy and excellent incremental accuracy, with extremely fast runtimes, and without the need to access a transistor-level STA engine.

Although the following discussion is directed to determining worst-case performance, the same techniques could be modified to find best-case performance by changing all of the worst-case presumptions to best-case presumptions.

DRAWINGS

Figures

DRAWINGS

Reference Numerals

1. Representation of Transistor as a Standard Cell

Figure 1:
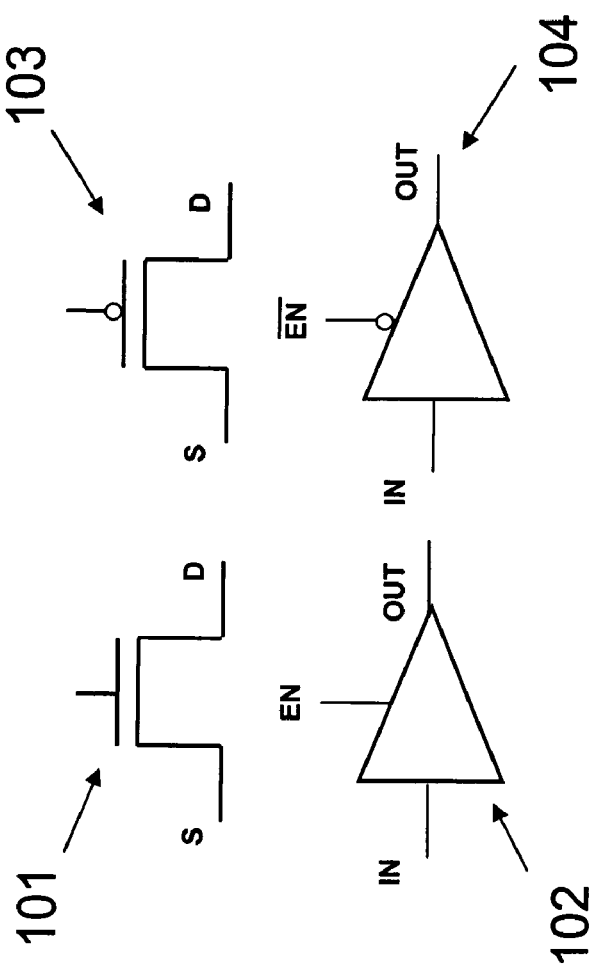
FIG. 1 shows PMOS and NMOS transistors and corresponding tri-state buffer representations.

Referring to FIG. 1, both an NMOS field effect transistor (FET) 101 and a PMOS FET 103 have 3 functional terminals, or nodes, with the conductance between the source (S) node and the drain (D) node being controlled by the gate (G) node. For a PMOS FET 103, a high gate voltage will place the transistor in a high-impedance or "tri-" state, in which high impedance between the three nodes permits a differing voltage on each of them. A low gate voltage places FET 103 into a low-impedance state, in which the drain has a similar voltage (and therefore logic value, in digital circuitry) as the source. An NMOS FET 101 operates in just the same way, but with a low gate voltage placing the FET 101 into a high-impedance state, and a high gate voltage placing it in a low-impedance state.

Almost all STA standard-cell libraries have tri-state buffers, with either a non-inverting enable 102 or an inverting enable 104. These buffers are typically used for bus arbitration between functional modules. Tri-state buffers 102 and 104 have 3 ports, an input port, an output port, and an enable port. The enable port, like the transistor gate, determines whether the buffer is disabled (like the FET high-impedance state) or enabled (like the FET low-impedance state). In the disabled state, the output port, like the FET drain, may have a different logic value than the input port, which parallels the function of the FET source. In the enabled state the output port has the same logic value as the input port. Accordingly, the behavior of a transistor in a circuit is exactly analogous to that of a tri-state buffer, with the transistor's S, G and D nodes mapping to the tri-state buffer's IN, EN and OUT ports respectively. In FIG. 1, NMOS transistor 101 maps to the tri-state buffer 102, and the PMOS transistor 103 to the tri-state buffer 104.

Figure 2:
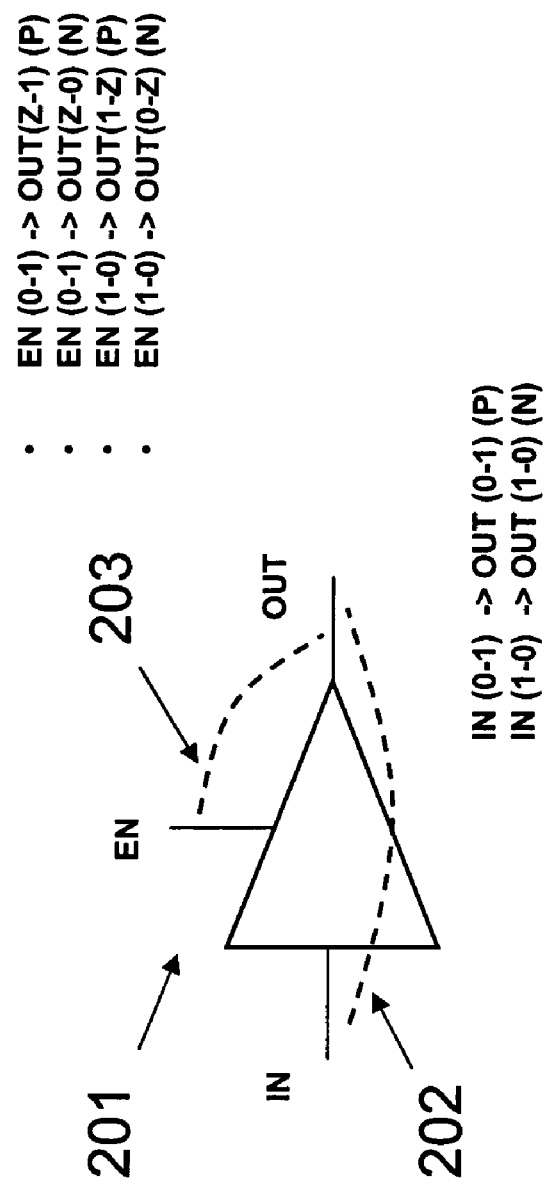
FIG. 2 shows the timing arcs of a tri-state buffer.

In cell-level static timing analysis, the term "timing arc" designates the relationship between an input and an output, or stated slightly differently, a signal propogation through a cell for a specific input signal transition and pre-existing cell state. It is necessary to assign a table of delays, rather than a single number, because the delays introduced by the cell vary according to signal characteristics at the cell input (termed "slew") and output circuitry driven by the cell (termed capacitance"). Accordingly, in a cell level STA program suite each timing arc is characterized by a table providing cell delay as a function of slew and capacitance. It should be noted that this method can also be extended to include current-source models, where the tables store drive current in place of delay. Referring to FIG. 2, timing arc 202, between the tri-state buffer 201 input and the output, can model (for enable "on") either the input pin going from low to high, or from high to low, and causing the output pin to make the same transition. Timing arc 203 can model the enable input going from low to high, and thereby causing the output pin to transition to the input pin state. Likewise it can model the enable input going from high to low, and thereby preventing the input from changing the output level (i.e. disabling timing arc 202).

In order to find the values for the tri-state buffer timing arcs for modeling the transistors, each transistor is pre-characterized using SPICE or similar analysis tools to determine the delays for all timing arcs, annotated as slew and capacitance values, which are stored in standard cell library (such as Synopsys Liberty [.lib]) format. The cell library is generated by identifying all possible width and length combinations of transistors in the circuit and running Spice simulation to generate a set of timing arcs for a corresponding cell in the library for each of these combinations. For an example, 90 nm library, it is found that transistors can take values from 150 nm to 1 u in steps of 5 nm. This gives a total of 171 different cells for each threshold voltage. Assuming 2 threshold voltages (lvt, hvt) and 4 different gate-lengths (nominal, +2, +4, +6 bias), there are a total of 1368 library cells. It should be noted that this number of cells is a common size of a standard-cell library. Therefore, this method does not lead to impractical library sizes. It must be noted that any library cell can be represented by this set of cell models.

Referring to FIG. 2, to correctly replace a transistor with a tri-state buffer, the tri-state buffer must be assigned the timing arcs of the transistor it is modeling. During a transition, a transistor can appear in a charging/discharging path in two ways.

(a) The input node to the device is pre-charged/pre-discharged and the transistor switched to conductive state. In this case the delay through the device is determined by the delay of the gate-to-drain arc.

(b) The transistor is in a conductive state, but a continuous path to either Vdd or Ground has just been established due to a series-connected device changing state. In this case the source-to-drain arc determines the delay.

When a transistor is replaced by a tri-state buffer, case (a) is modeled by the EN to OUT enable arc (arc 203 in FIG. 2) and case (b) is modeled by the IN to OUT arc (arc 202 in FIG. 2). A preferred embodiment is implemented in full static CMOS gates, such that NMOS transistors have only falling arcs and PMOS transistors have only rising arcs.

Once every transistor is replaced by a tri-state buffer, any transistor-level circuit can be represented as a collection of tri-state buffers in a cell-level netlist format. Each transistor is pre-characterized using SPICE or similar analysis tools to determine the delays for all timing arcs, annotated as slew and capacitance values, which are stored in standard Synopsys Liberty (.lib) or equivalent format. The circuit can now be analyzed using an STA engine, but to gain an accurate analysis it is necessary to model the inter-transistor effects. The next section discusses the preprocessing steps necessary to adapt the basic method of the invention for series-parallel connections and pass-gates ("transmission gates"). Although the examples given are only for NMOS devices, skilled persons will understand the parallel analysis that can be undertaken for PMOS devices.

3. Modeling Common Transistor Configurations

Parallel-Connected Devices

Figure 3:
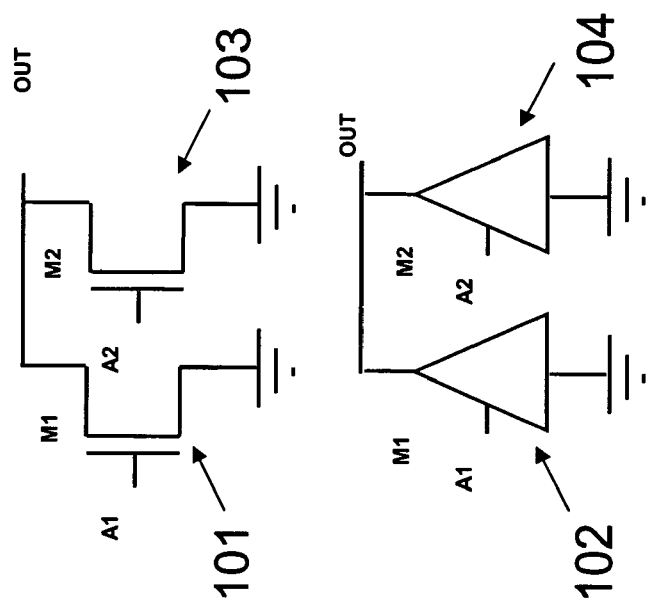
FIG. 3 shows the tri-state buffer representation of parallel-connected transistors.

FIG. 3 shows two parallel-connected NMOS devices 101 and 103. This configuration is most commonly found in NOR gates. Suppose arrival time, considered as a delay relative to some precipitating event, is denoted by AT(AN) and the gate-drain delays through the transistors are D1 and D2. The worst-case delay through this configuration occurs when both FETs 301 and 303 begin in the nonconducting state (output high), and a single transistor is placed into conducting state by a change in its gate voltage, thereby changing the output state. More specifically, the worst case delay occurs when the FET placed into a conducting state has the larger (AT(AN)+D) value. A cell level STA engine that has received a netlist having the two tri-state buffers 302 and 304 will construct two separate enable (input state to output) arcs, one from A1 and one from A2, having delay D1 and D2 respectively. The longest delay through this configuration is:

$$\max(AT(A1)+D1, AT(A2)+D2)$$

for the case in which a single FET is switched from nonconducting to conducting state. It is clear that this case is modeled correctly by the tri-state buffer representation.

Series-Connected Devices

Figure 4:
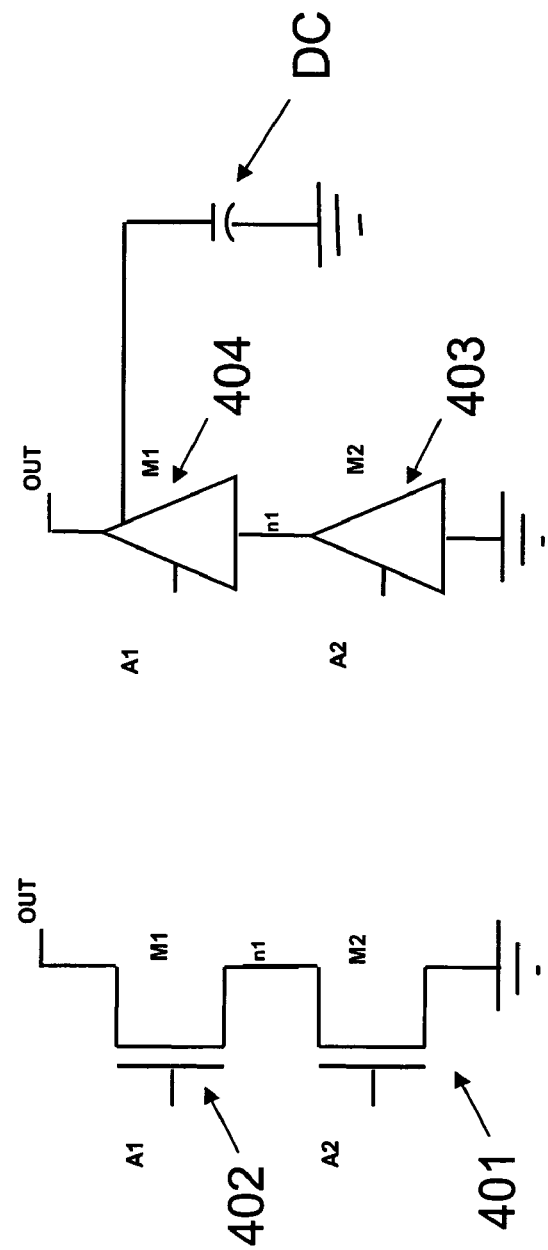
FIG. 4 shows the tri-state buffer representation of series-connected transistors.

Analysis of a series-connected configuration is somewhat more complicated. Referring to FIG. 4, devices 401 and 402 are series-connected NMOS devices having gate voltages A2 and A1, respectively. The gate-drain delays of the two transistors are DG1 and DG2, while the source-drain delays are DS1 and DS2 respectively. The slowest path through this configuration depends on the relative arrival times at the gates. The latest time at which OUT transitions, due to a polarity change in A1, A2 or both, is given by the max(a, b), where $$a = AT(A1) + DG1, \quad (1)$$

and $$b = AT(A2) + DG2 + DS1 \quad (2)$$

When a<b, the slowest path is A2→n1, n1→Out. This path will be identified and evaluated correctly without modifying the scheme set forth above.

The case in which a>b requires a modification to the cell-level model of 404, if the STA is to perform correctly. Here, the slowest path is A1→out, which an STA will identify correctly. The STA will however, if not further informed, designate the delay as simply the enable delay of tri-state buffer 404. This neglects the effect of the series-connected transistor 401, which increases the delay of this path. The delay of buffer 404 is modified to reflect this phenomenon.

In a Synopsis STA system, this modification to the delay of buffer 404 is performed by using the related_output_net_capacitance attribute in the Synopsys Liberty format (similar attributes exist in other cell-level static timing tools as well). Using this attribute, a dummy node may be assigned to a cell. To model the extra delay, a dummy capacitor DC is attached to this dummy node, having capacitance depending on the number and strength of transistors in the stack below the transistor in question. This dummy node provides the "related output," the capacitance of which models the gate switching delay in the output of transistor 402, caused by transistor 401, while having a zero value for effect on source delay. The delay tables in the library files are 3 dimensional with the 3 axes being slew, load capacitance and the capacitance on the dummy node. A survey of STA engines indicates that all are capable of accepting and interpreting this format.

In a circuit there may be many instances of a particular stack of transistors ("stack-type"). According to a preferred embodiment, the translation of a transistor-level netlist to a cell-level netlist includes the insertion of a dummy node having a dummy capacitance value, for each transistor in each stack, other than the bottom transistor. A different dummy capacitance must be used for each transistor-type in each position in each stack-type ("transistor/stack-position") where that transistor-type occurs in the circuit.

For example, a transistor type A, occurring as the third transistor in a particular four level stack-type must be assigned a different dummy capacitance than a transistor type A, occurring as the fourth transistor, in the same stack-type (or a different stack-type).

The delay characteristics for each transistor/stack-position are obtained by running SPICE on each stack-type present in the circuit. The delay of each transistor/stack-position is measured and is used to derive the capacitance value for each dummy node. The resultant dummy node capacitance value is used for every instance of the transistor/stack-position in the circuit. It is important to note that although a dummy capacitance value must be found for each transistor/stack-position, it is a one time effort. This approach is far superior to having a separate .lib entry for each transistor/stack-position instance in the circuit, which would cause an explosion of the library size. The above-described embodiment only requires the addition of the dimension of dummy node capacitance to the STA delay tables, which appears to be easily accommodated by the capabilities of all commercially available cell-level STA engines.

Transmission Gates

Figure 5:
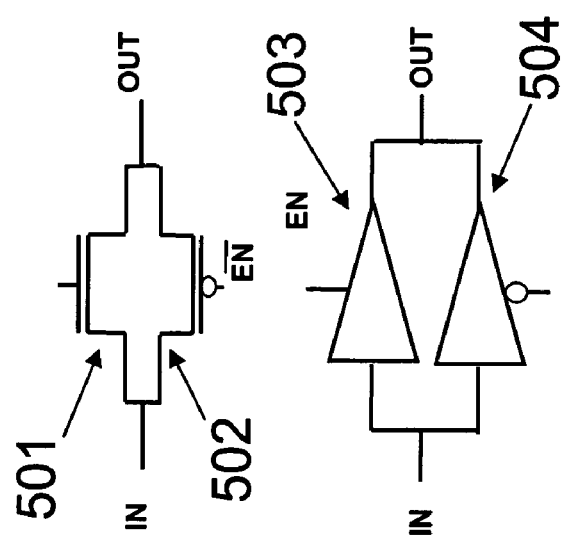
FIG. 5 shows the tri-state buffer representation of transmission gates.

Referring to FIG. 5, the SPICE to cell-level netlist translator recognizes transmission gates, such as that constituted by FETs 501 and 502, and treats them in a special manner. In transmission gates, parallel NMOS and PMOS FETs 501 and 502 switch simultaneously, which must be taken into account while performing the characterization, to avoid introducing pessimism into the analysis. In another difference, which addresses the fact transmission gates can pass both logic '0' and logic '1,' the corresponding N and P tri-state buffers, 503 and 504, are assigned both rising and falling timing arcs.

4. Practical Examples of Applications of Proposed Method

Figure 6:
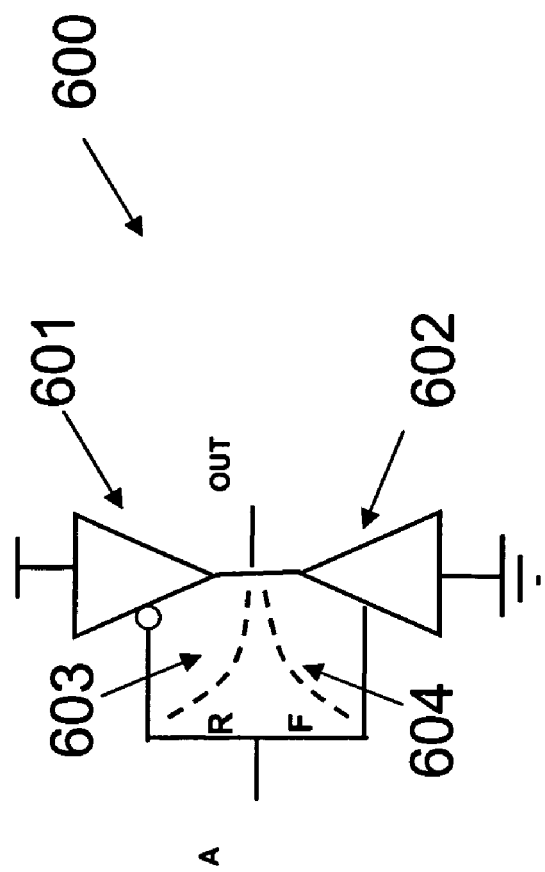
FIG. 6 shows the tri-state representations of an Inverter, along with the relevant timing arcs.

Referring to FIG. 6, a cell level model for a two-FET inverter 600 has a worst case rise time when the buffer 601, which models a PMOS FET, is enabled. Likewise, the worst case fall time for inverter 600 occurs when the buffer 602, which models an NMOS FET, is enabled. The gate->drain delay of the PMOS FET modeled by buffer 601 (arc 603) is used for rise time analysis. Similarly, the gate->drain delay of the NMOS FET modeled by buffer 602 (arc 604) is used for fall time analysis.

Figure 7:
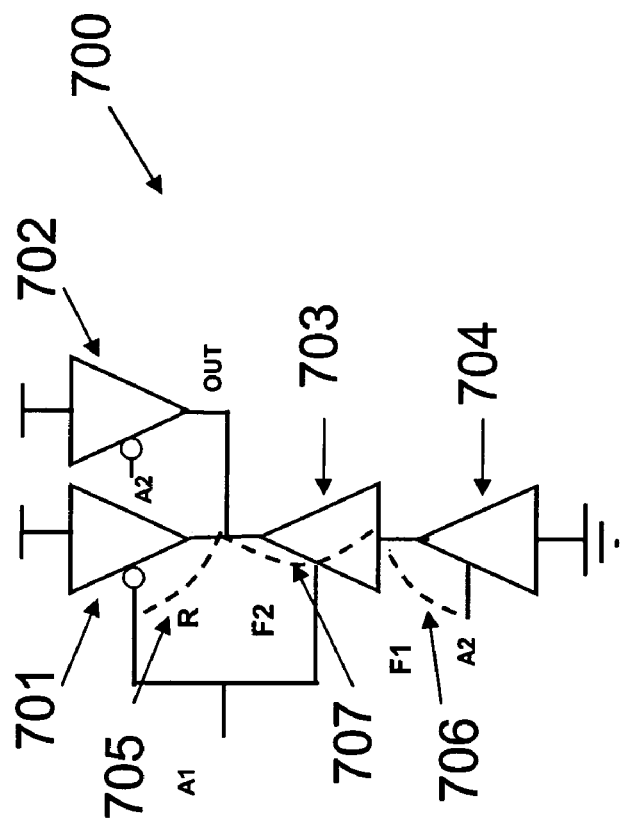
FIG. 7 shows the tri-state representations of a NAND gate, along with the relevant timing arcs.

Referring to FIG. 7, a cell level model representing a NAND gate 700 has a worst case rise time when one of the PMOS FETs modeled by buffers 701 and 702 "turns on." The slower of the two arcs 705 is used by the STA engine. The case for fall time analysis is more complicated, and is handled as discussed in the text accompanying FIG. 3. The figure shows the arcs 706 and 707 only for the case where AT(A2)+DG2+DS1>AT(A1)+DG1.

Figure 8:
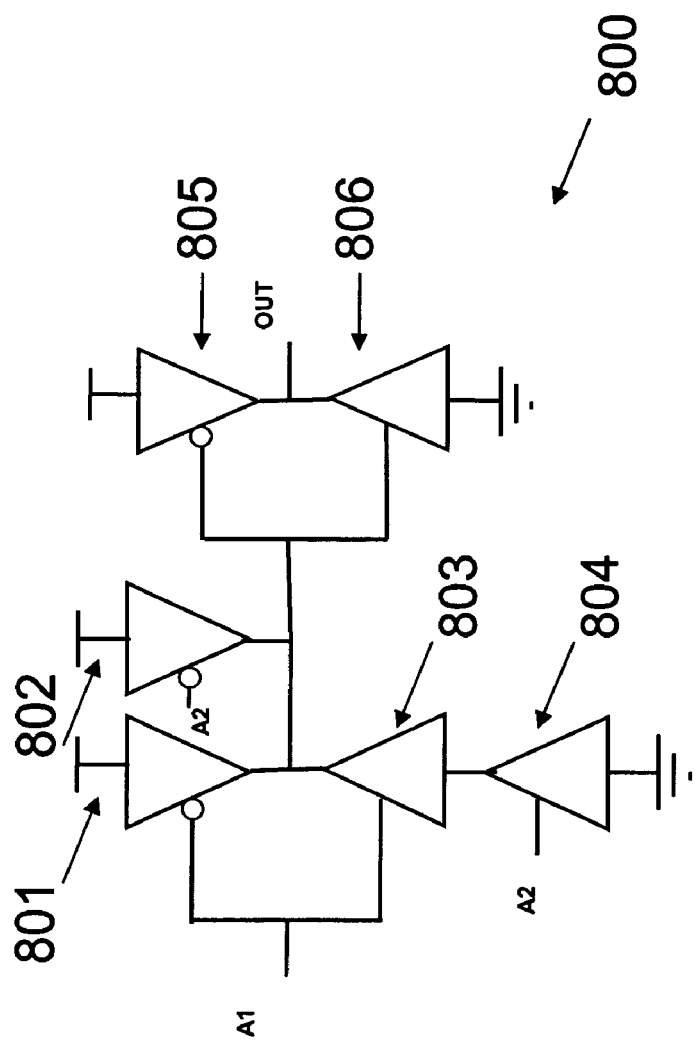
FIG. 8 shows the tri-state representations of an AND gate, along with the relevant timing arcs.

Referring to FIG. 8, for a multi-stage AND gate 800 the worst case rise(fall) timing path is the worst case fall (rise) timing path through the devices 801, 802, 803 and 804, which together make a NAND gate 810 combined with the worst case rise(fall) time through the devices 805 and 806 which make an inverter 812. Because the cell level models already model inter-transistor effects, there is no need to separate components into channel-connected components, or stages, as is necessary for transistor-level analysis techniques. As inter-transistor effects are already modeled, the analysis takes the simpler form of timing waveforms that are being propagated along timing arcs. For this reason, the present method scales very well to multi-stage circuits. This discussion can be extended to a circuit of any size/complexity, with the analysis remaining the same.

The above described preferred embodiment may also be used to perform STA on a large custom block. The SPICE to cell-level netlist translator can parse a SPICE netlist of any size and convert it to the equivalent cell-level netlist format.

To preserve the data flow direction, the translator first divides the circuit nodes between levels defined as number of FETs between the particular node and $V_{DD}$ or $V_{ss}$ and determines for each FET whether source or drain is at the higher level. In a second step, every FET is replaced with a tri-state buffer, with the lower-level node (the node closer to $V_{DD}$ or $V_{ss}$) being replaced with the input and the higher-level node with the output.

5. Application of Proposed Invention to Leakage Analysis

The modeling of transistors by tri-state buffers can also be used to facilitate leakage power analysis. There are two transistor states that cause significant leakage power consumption: Subthreshold state and gate leakage state. Subthreshold state occurs when a transistor is off and its drain and source have opposite logic values, whereas gate leakage state occurs when a transistor is on and its source and drain have the same logic values, which are opposite to that of the gate. In other states, the leakage is considered to be nearly zero, and is neglected.

While performing cell-level leakage analysis on a circuit, the average leakage power values of all cell instances are added to determine the total leakage power for the design. Similarly, an average leakage value can be stored for each modeled transistor. The leakage value assigned to each transistor is scaled depending on the proportion of cell (e.g. gate) states that cause the transistor to be placed in a leakage inducing state. Different gate topologies create differing average leakage power values for the transistors comprising the gate. For example, when a transistor is the only device in a pull-up/pull-down network, it is placed into subthreshold state, therefore leaking significantly, for half the total number of cell states. When it is stacked with another device (as modeled by buffers 803 and 804 in FIG. 8), it leaks for $\frac{1}{4}^{th}$ the total cell states; in a stack of 3 for $\frac{1}{8}^{th}$, ... and so on. A similar analysis can be performed for gate leakage. Here again the related_output_net_capacitance attribute can be used to note the scaling factor for average leakage current assigned to the modeled transistor. The dummy node capacitance is assigned based on topology analysis and is then accessed by the power calculation tool, which is programmed to scale the average cell leakage power accordingly.

It should be noted that this same methodology can be used for state dependent leakage computation.

6. Scope and Limitations of Proposed Methodology

This method, being static in nature, is limited to worst case and best case timing analysis. If the method were to be adopted for dynamic timing analysis, standard cell behavior would have to be characterized for state changes and a cell-level netlist, consisting only of the conducting devices, would have to be determined for each state. This is cumbersome, and therefore, this method does not lend itself naturally to dynamic timing analysis analysis.

In one preferred embodiment, in some instances a number of transistors are grouped together and replaced by a cell model, such as a gate. A circuit modeling program, such as SPICE, is run to find the timing characteristics of the gate and these characteristics are represented in the cell model, in the cell model format, such as Synopsys Liberty, being used. The complete circuit is now represented as a hybrid cell and transistor-level circuit.

The preceding description is exemplary in nature, and should not be treated as limiting the scope of the invention. Skilled persons will recognize various permutations that could be made to the basic scheme of the invention.

What is claimed is:

1. A method of using a static performance analyzer that accepts as input a cell-level netlist, to perform static timing analysis on a circuit represented by a transistor-level netlist, said method comprising:

converting said transistor-level netlist to a cell-level netlist by modeling each transistor within the transistor-level netlist as a corresponding tri-state buffer cell within the cell-level netlist, wherein an enable pin of a tri-state buffer is used to model a gate terminal of a corresponding transistor, and wherein an input pin of the tri-state buffer is used to model a drain of the corresponding transistor, and wherein an output pin of the tri-state buffer is used to model a source of the corresponding transistor;

operating a computer implemented analysis tool separate from the static performance analyzer to determine gate-to-drain timing arc data and source-to-drain timing arc data for each transistor within the transistor-level netlist;

storing the determined gate-to-drain and source-to-drain timing arc data for each transistor as enable timing arc data and input-to-output timing arc data, respectively, for the tri-state buffer used to model the transistor, within a computer readable library accessible by the static performance analyzer; and operating a computer to execute the static performance analyzer to perform a static timing analysis of the cell-level netlist, wherein the static timing analysis is performed based on the enable timing arc data and the input-to-output timing arc data stored within the computer readable library for each tri-state buffer in the cell-level netlist, whereby results of the static timing analysis of the cell-level netlist represent static timing analysis results of the transistor-level netlist.

2. The method of claim 1, wherein said transistor-level netlist is in the form of a hardware description.

3. The method of claim 1, wherein the tri-state buffer used to model the transistor includes a dummy terminal having a capacitor attached to model an inter-transistor effect caused by transistors stacked under the modeled transistor.

4. The method of claim 3, wherein the capacitance value of the capacitor depends on effective drive strength of the transistors stacked under the modeled transistor.

5. The method of claim 1, wherein at least one set of transistors are grouped together into one cell.

6. The method of claim 5, wherein said cell is a gate.

7. The method of claim 1, wherein said static timing analysis is a best case static timing analysis.

8. The method of claim 1, wherein said static timing analysis is a worse case static timing analysis.

9. The method of claim 1, wherein said static timing analysis is a statistical worse case static timing analysis, finding a distribution of worse case timing performances, in dependence on a distribution of circuit device performance characteristics.

10. The method of claim 1, wherein said static timing analysis is a statistical best case static timing analysis, finding a distribution of best case timing performances, in dependence on a distribution of circuit device performance characteristics.

11. The method of claim 1, wherein results of the static timing analysis of the cell-level netlist represent static timing analysis results of the transistor-level netlist obtained without execution of a transistor-level static timing analysis tool.

* * * * *